(12) United States Patent
Brun et al.

(10) Patent No.: US 12,604,522 B2
(45) Date of Patent: Apr. 14, 2026

(54) UNIVERSAL ELECTRICALLY INACTIVE DEVICES FOR INTEGRATED CIRCUIT PACKAGES

(71) Applicant: Intel Corporation, Santa Clara, CA (US)

(72) Inventors: Xavier Brun, Hillsboro, OR (US); Timothy Gosselin, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 910 days.

(21) Appl. No.: 17/100,449

(22) Filed: Nov. 20, 2020

(65) Prior Publication Data

US 2022/0165625 A1 May 26, 2022

(51) Int. Cl.
| | |
|---|---|
| *H10D 86/01* | (2025.01) |
| *H01L 21/762* | (2006.01) |
| *H01L 21/768* | (2006.01) |

(52) U.S. Cl.
CPC ....... *H10D 86/01* (2025.01); *H01L 21/76213* (2013.01); *H01L 21/76886* (2013.01)

(58) Field of Classification Search
CPC .............. H01L 21/84; H01L 21/76213; H01L 21/7688; H01L 21/76886; H10D 86/01
See application file for complete search history.

(56) References Cited

U.S. PATENT DOCUMENTS

| | | | | |
|---|---|---|---|---|
| 9,865,567 | B1 * | 1/2018 | Chaware | .................. H01L 25/50 |
| 10,115,688 | B2 * | 10/2018 | Karlovsky | .............. H01L 24/83 |

| | | | | |
|---|---|---|---|---|
| 2010/0297842 | A1 * | 11/2010 | Ke | ........................... H01L 24/11 |
| | | | | 257/E21.508 |
| 2011/0026232 | A1 | 2/2011 | Lin et al. | |
| 2016/0322330 | A1 | 11/2016 | Lin et al. | |
| 2018/0138101 | A1 * | 5/2018 | Yu | ........................... H01L 25/03 |
| 2019/0067157 | A1 | 2/2019 | Lin et al. | |
| 2019/0318975 | A1 * | 10/2019 | Shi | ...................... H01L 23/5389 |

(Continued)

FOREIGN PATENT DOCUMENTS

| | | |
|---|---|---|
| KR | 2016-0129687 | 11/2016 |
| TW | 201834086 A | 9/2018 |

OTHER PUBLICATIONS

International Search Report and Written Opinion for PCT Patent Application No. PCTUS2012/049603, dated Dec. 30, 2021.

(Continued)

*Primary Examiner* — Benjamin Tzu-Hung Liu
(74) *Attorney, Agent, or Firm* — Essential Patents Group, LLP

(57) ABSTRACT

An integrated circuit package may be fabricated with a universal dummy device, instead of utilizing a dummy device that matches the bump layer of an electronic substrate of the integrated circuit package. In one embodiment, the universal dummy device may comprise a device substrate having an attachment surface and a metallization layer on the attachment surface, wherein the metallization layer is utilized to form a connection with the electronic substrate of the integrated circuit package. In a specific embodiment, the metallization layer may be a single structure extending across the entire attachment surface. In another embodiment, the metallization layer may be patterned to enable gap control between the universal dummy device and the electronic substrate.

20 Claims, 5 Drawing Sheets

(56) References Cited

U.S. PATENT DOCUMENTS

| | | | |
|---|---|---|---|
| 2019/0371694 A1 | 12/2019 | Hsu et al. | |
| 2019/0393123 A1 | 12/2019 | Wuu et al. | |
| 2020/0013732 A1* | 1/2020 | Sikka | .................. H05K 1/0271 |
| 2020/0194330 A1 | 6/2020 | Ramanathan et al. | |
| 2020/0243497 A1 | 7/2020 | Hsu et al. | |

OTHER PUBLICATIONS

National Search Report and Written Opinion for Dutch Patent Application No. 2029424, dated Feb. 20, 2023.
International Preliminary Report on Patentability from PCT/US2021/049603 notified Jun. 1, 2023, 7 pgs.
Extended European Search Report from European Patent Application No. 21895297.6 notified Sep. 18, 2024, 11 pgs.
Office Action from Taiwanese Patent Application No. 110134953 notified Jun. 24, 2025, 16 pgs.
Office Action from Taiwanese Patent Application No. 110134953 notified Oct. 27, 2025, 23 pgs.

\* cited by examiner

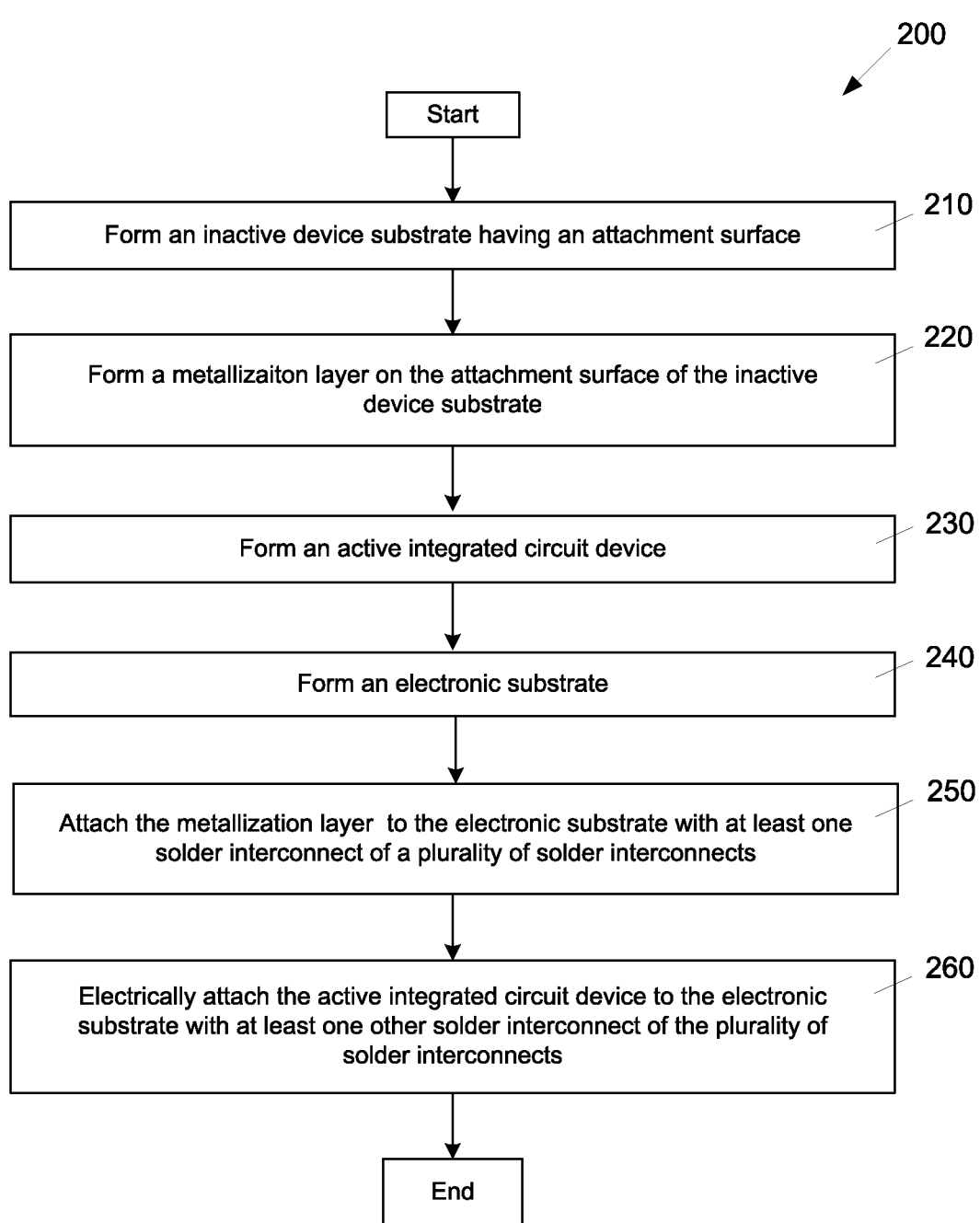

200

Start

Form an inactive device substrate having an attachment surface    210

Form a metallizaiton layer on the attachment surface of the inactive device substrate    220

Form an active integrated circuit device    230

Form an electronic substrate    240

Attach the metallization layer to the electronic substrate with at least one solder interconnect of a plurality of solder interconnects    250

Electrically attach the active integrated circuit device to the electronic substrate with at least one other solder interconnect of the plurality of solder interconnects    260

End

FIG. 7

UNIVERSAL ELECTRICALLY INACTIVE DEVICES FOR INTEGRATED CIRCUIT PACKAGES

TECHNICAL FIELD

Embodiments of the present description generally relate to the field of integrated circuit package or assembly fabrication, and, more specifically, to the use of electrically inactive or "dummy" devices in the configuration of the integrated circuit packages or assemblies.

BACKGROUND

The integrated circuit industry is continually striving to produce ever faster, smaller, and thinner electronic devices and packages for use in various electronic products, including, but not limited to, computer servers and portable products, such as portable computers, electronic tablets, cellular phones, digital cameras, and the like.

One pathway to achieving these goals is the tighter packaging of integrated circuit devices. One such arrangement, known as a stacked composite die, comprises a plurality of integrated circuit devices attached to an electronic substrate, either passive or active, with a mold material layer on the electronic substrate that substantially surrounds or encircles the plurality of integrated circuit devices. Although such an integrated circuit package may be an effective way of packaging integrated circuit devices, it has a higher warpage than monolithic silicon, because of differing coefficients of thermal expansion between the integrated circuit devices themselves and between the mold material layer and the electronic devices. Such warpage can cause delamination and/or cracking of the mold material layer, which can result in the failure of the integrated circuit package. The warpage from the temperature gradients may occur during temperature cycles from the operation of the integrated circuit package and/or from manufacturing processes, such as from thermal compression bonding of the integrated circuit package to an electronic board.

One technique to prevent or minimize warpage is by optimizing the positions of the integrated circuit devices along with the use of electrically inactive or dummy devices. An electrically inactive or dummy device is simply an inert semiconductor substrate. In other words, the electrically inactive or dummy device performs no electrical function within the integrated circuit package and may simply be a circuit-less semiconductor material to match that used in the active integrated circuit devices of the integrated circuit package, as will be understood to those skilled in the art.

Generally, the dummy devices are fabricated for each integrated circuit package floorplan and taken through all of the standard steps, as are all of the active integrated circuit devices, to prepare them for attachment to the electronic board, including, but not limited to, planarization, material deposition, lithography loop steps, plating, and the like, in order to match the solder bump layer between the electrically inactive/dummy devices and the electronic board, as will be understood to those skilled in the art. The electrically inactive/dummy devices are then prepared and attached along with the active integrated circuit devices, including, but not limited to, flux/solder formation, thermocompression bonding, underfilling, and the like. However, preparing the dummy devices in this manner increases the number of tape-in and masks required for each product (i.e. the integrated circuit package), which adds complexity and reduces flexibility for layout changes in the fabrication of the integrated circuit package.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

FIG. 7 is a flow chart of a process of fabricating an integrated circuit package, according to an embodiment of the present description.

DETAILED DESCRIPTION

Figure 1:
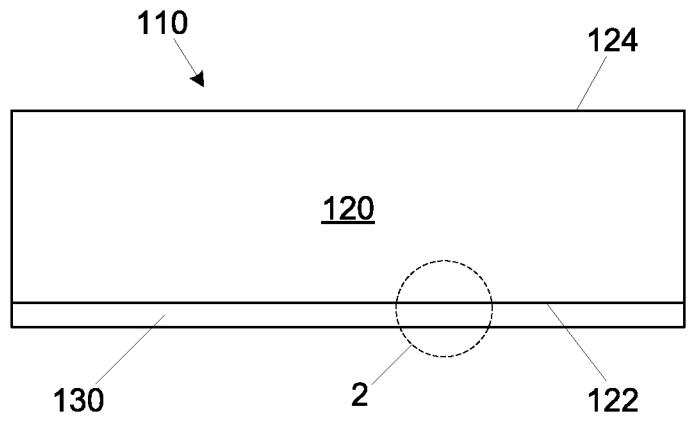
FIG. 1 is a side cross-sectional view of universal dummy device, according to one embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The term "package" generally refers to a self-contained carrier of one or more dice, where the dice are attached to the package substrate, and may be encapsulated for protection, with integrated or wire-bonded interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

Here, the term "cored" generally refers to a substrate of an integrated circuit package built upon a board, card or wafer comprising a non-flexible stiff material. Typically, a small printed circuit board is used as a core, upon which integrated circuit device and discrete passive components may be soldered. Typically, the core has vias extending from one side to the other, allowing circuitry on one side of the core to be coupled directly to circuitry on the opposite side of the core. The core may also serve as a platform for building up layers of conductors and dielectric materials.

Here, the term "coreless" generally refers to a substrate of an integrated circuit package having no core. The lack of a core allows for higher-density package architectures, as the through-vias have relatively large dimensions and pitch compared to high-density interconnects.

Here, the term "land side", if used herein, generally refers to the side of the substrate of the integrated circuit package closest to the plane of attachment to a printed circuit board, motherboard, or other package. This is in contrast to the term "die side", which is the side of the substrate of the integrated circuit package to which the die or dice are attached.

Here, the term "dielectric" generally refers to any number of non-electrically conductive materials that make up the structure of a package substrate. For purposes of this disclosure, dielectric material may be incorporated into an integrated circuit package as layers of laminate film or as a resin molded over integrated circuit dice mounted on the substrate.

Here, the term "metallization" generally refers to metal layers formed over and through the dielectric material of the package substrate. The metal layers are generally patterned to form metal structures such as traces and bond pads. The metallization of a package substrate may be confined to a single layer or in multiple layers separated by layers of dielectric.

Here, the term "bond pad" generally refers to metallization structures that terminate integrated traces and vias in integrated circuit packages and dies. The term "solder pad" may be occasionally substituted for "bond pad" and carries the same meaning.

Here, the term "solder bump" generally refers to a solder layer formed on a bond pad. The solder layer typically has a round shape, hence the term "solder bump".

Here, the term "substrate" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

Here, the term "assembly" generally refers to a grouping of parts into a single functional unit. The parts may be separate and are mechanically assembled into a functional unit, where the parts may be removable. In another instance, the parts may be permanently bonded together. In some instances, the parts are integrated together.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, magnetic or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

For the purposes of the present disclosure, the term "high aspect ratio" means a structure has a height (z-direction) to width (x-direction) ratio of greater than about 2.

Embodiments of the present description relate to a universal dummy device for an integrated circuit package and processes for forming the same, instead of utilizing a dummy device that matches the bump layer of an electronic substrate of the integrated circuit package. In one embodiment, the universal dummy device may comprise a device substrate having an attachment surface and a metallization layer on the attachment surface, wherein the metallization layer is utilized to form a connection with the electronic substrate of the integrated circuit package. In a specific embodiment, the metallization layer may be a single structure extending across the entire attachment surface. In another embodiment, the metallization layer may be patterned to enable gap control between the universal dummy device and the electronic substrate.

FIG. 1 illustrates a universal dummy device 110 comprising an inactive device substrate 120 having an attachment surface 122 and an opposing backside surface 124, and a metallization layer 130 on the attachment surface 122 of the inactive device substrate 120. In one embodiment of the present description, the inactive device substrate 120 may comprise a semiconductive material, including, but not limited to, silicon, germanium, and the like. In a further embodiment of the present description, the metallization layer 130 may be formed with a "back side metallization" process. As will be understood to those skilled in the art, back side metallization is generally formed on backside surfaces of the active integrated circuit devices in the integrated circuit package to enhance thermal conductivity. The term "inactive device substrate" for the purposes of the present description is defined to mean a substrate that has no electrical or circuitry function.

Figure 2:
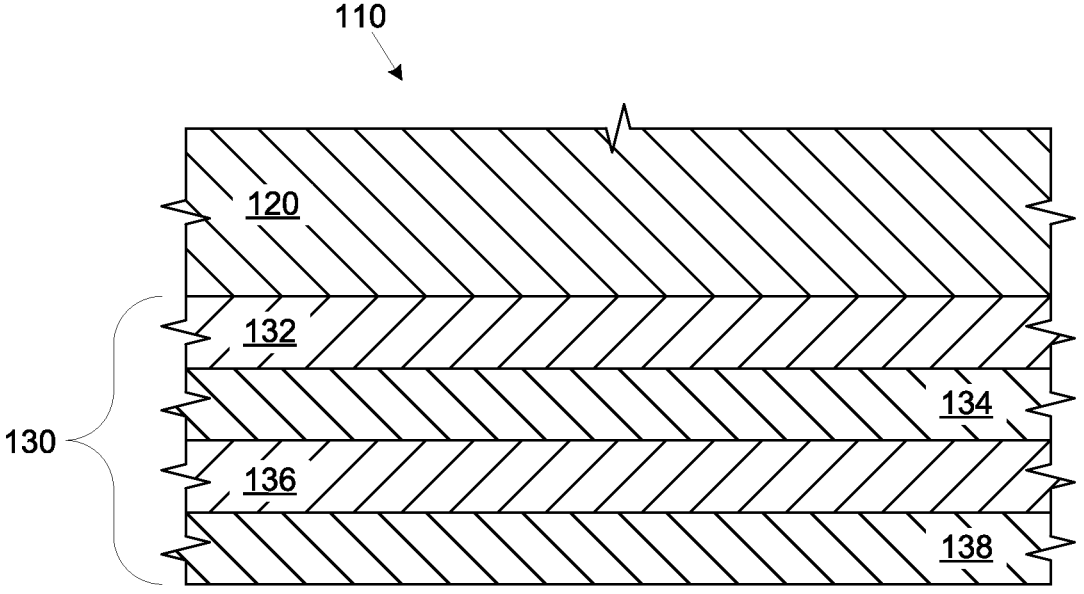
FIG. 2 is view of inset 2 of FIG. 1 illustrating a stack metallization layer on an inactive device substrate, according to an embodiment of the present description.

In one embodiment of the present description, as shown in FIG. 2, the metallization layer 130 may comprise a stack of layers (illustrated as a first layer 132, a second layer 134, a third layer 136, and a fourth layer 138) on the inactive device substrate 120. The layers may be utilized for adhesion and/or barrier purposes with the outermost or fourth layer 138 being utilized to assure good wetting and attachment strength to solder (not shown), which will be used to attach the universal dummy device 110 to an electronic substrate (not shown), as will be discussed. As such, in one embodiment of the present description, the outermost or fourth layer 138 may be an appropriate low-oxidation metal, including, but not limited to, gold, silver, and nickel. The layers, e.g. the first layer 132, the second layer 134, the third layer 136, and the fourth layer 138, may be formed by any appropriate method, including, but not limited to, electronic beam evaporation, sputter deposition, flash coating, and the like. It is, of course, understood that the metallization layer 130 may be any number of layers, and may only be one layer, if the single layer can both adhere to the inactive device substrate 120 and provide a wettable surface for solder attachment, as will be discussed.

In a specific embodiment of the present description, the first layer 132 may be a dielectric material, such as silicon nitride. In another specific embodiment of the present description, the second layer 134 may comprise titanium. In a further specific embodiment of the present description, the third layer 136 may be a nickel-vanadium alloy. In still a further specific embodiment of the present description, the final or fourth layer 138 may be gold.

Figure 3:
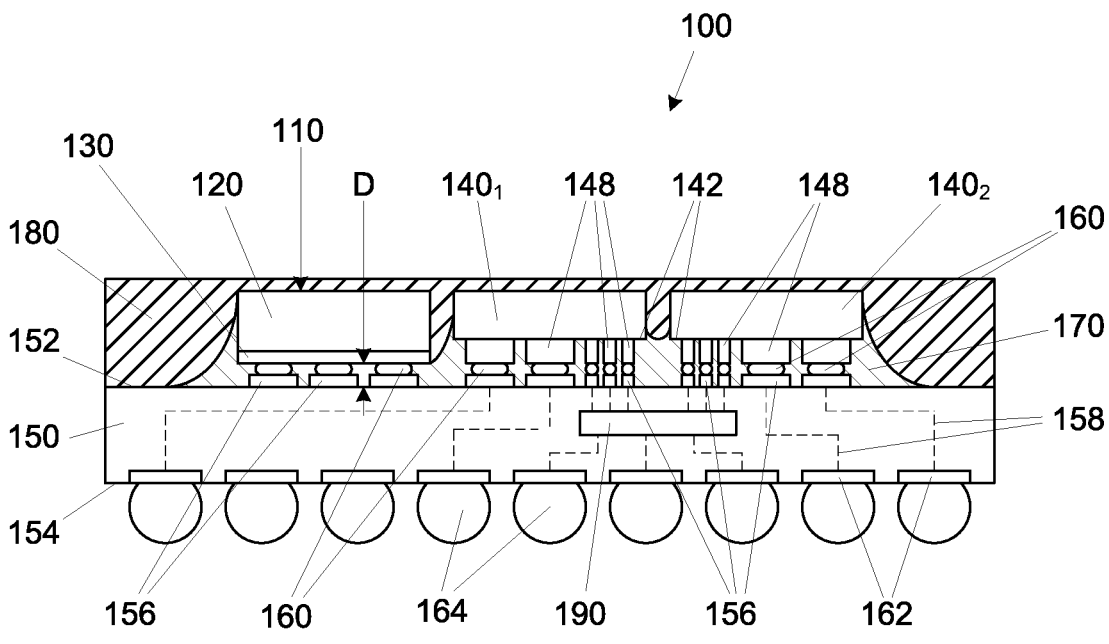
FIG. 3 is a side cross-sectional view of an integrated circuit package, according to an embodiment of the present description.

FIG. 3 illustrates an integrated circuit package 100 having at least one integrated circuit device (illustrated as a first integrated circuit device $140_1$ and a second integrated circuit device $140_2$) and at least one universal dummy device 110 attached to an electronic substrate 150 in a configuration generally known as a flip-chip or controlled collapse chip connection ("C4") configuration, according to an embodiment of the present description.

The first integrated circuit device $140_1$ and the second integrated circuit device $140_2$ may be any appropriate active device, including, but not limited to, a microprocessor, a chipset, a graphics device, a wireless device, a memory device, an application specific integrated circuit, combinations thereof, stacks thereof, or the like. As shown, the first integrated circuit device $140_1$ and the second integrated circuit device $140_2$ may each have an attachment or first surface 142.

In an embodiment of the present description shown in FIG. 3, the first integrated circuit device $140_1$, the second integrated circuit device $140_2$, and the universal dummy device 110 may be attached to the electronic substrate 150 with a plurality of device-to-substrate interconnects 160. In one embodiment of the present description, the device-to-substrate interconnects 160 may extend between bond pads 156 on a first surface 152 of the electronic substrate 150 and bond pads 148 on the first surface 142 of the first integrated circuit device $140_1$ and the second integrated circuit device $140_2$, and between bond pads 156 on the first surface 152 of the electronic substrate 150 and the metallization layer 130 of the universal dummy device 110.

In one embodiment, the device-to-substrate interconnects 160 may be solder balls formed from tin, lead/tin alloys (for example, 63% tin/37% lead solder), and high tin content alloys (e.g. 90% or more tin—such as tin/bismuth, eutectic tin/silver, ternary tin/silver/copper, eutectic tin/copper, and similar alloys). The device-to-substrate interconnects 160 may be in electrical communication with integrated circuitry (not shown) within their respective active integrated circuit devices, i.e. the first integrated circuit device $140_1$ and the second integrated circuit device $140_2$.

An electrically-insulating underfill material 170, such as an epoxy material, may be disposed between the first integrated circuit device $140_1$ and the electronic substrate 150, between the second integrated circuit device $140_2$ and the electronic substrate 150, and between the universal dummy device 110 and the electronic substrate 150. As will be understood to those skilled in the art, the underfill material 170 may be dispensed between the first surface 142 of the -US integrated circuit devices $140_1$ and $140_2$ and the electronic substrate 150, and between the metallization layer 130 of the universal dummy device 110 and the electronic substrate 150, as a viscous liquid and then hardened with a curing process. The underfill material 170 may also be a molded underfill material, as known in the art. The underfill material 170 may provide structural integrity and may prevent contamination, as will be understood to those skilled in the art.

The electronic substrate 150 may be any appropriate device, including a passive device (such as an interposer, a circuit board, and the like), an active device ((e.g. having integrated circuitry), such as, a microprocessor, a chipset, a graphics device, a wireless device, a memory device, an application specific integrated circuit, combinations thereof, stacks thereof, or the like), or a combination of an active device 190 embedded in the passive electronic substrate 150, as shown in FIG. 3.

When the electronic substrate 150 is completely or partially a passive device, it may comprise a plurality of dielectric material layers (not shown), which may include build-up films and/or solder resist layers, and may be composed of an appropriate dielectric material, including, but not limited to, bismaleimide triazine resin, fire retardant grade 4 material, polyimide material, silica filled epoxy material, glass reinforced epoxy material, and the like, as well as low-k and ultra low-k dielectrics (dielectric constants less than about 3.6), including, but not limited to, carbon doped dielectrics, fluorine doped dielectrics, porous dielectrics, organic polymeric dielectrics, and the like. The electronic substrate 150 may further include conductive routes 158 or "metallization" (shown in dashed lines) extending through the electronic substrate 150. The bond pads 156 on the first surface 152 of the electronic substrate 150 may be in electrical contact with the conductive routes 158, and the conductive routes 158 may extend through the electronic substrate 150 and be electrically connected to bond pads 162 on a second surface 154 of the electronic substrate 150. However, the bond pads 156 to which the universal dummy device 110 is attached need not be attached to the conductive routes 158, as the universal dummy device 110 is electrically inactive.

As will be understood to those skilled in the art, the conductive routes 158 may be a combination of conductive traces (not shown) and conductive vias (not shown) extending through the plurality of dielectric material layers (not shown). These conductive traces and conductive vias are well known in the art and are not shown in FIG. 3 for purposes of clarity. The conductive traces and the conductive vias may be made of any appropriate conductive material, including but not limited to, metals, such as copper, silver, nickel, gold, aluminum, alloys thereof, and the like. As will be understood to those skilled in the art, the electronic substrate 150 may be a cored substrate or a coreless substrate.

As will be understood to those skilled in the art, the electronic substrate 150 may reroute a fine pitch (center-to-center distance between the bond pads) of the integrated circuit device bond pads 148 to a relatively wider pitch of the bond pads 162 on the second surface 154 of the electronic substrate 150. In one embodiment of the present description, external interconnects 164 may be disposed on the bond pads 162 on the second surface 154 of the electronic substrate 150. The external interconnects 164 may be any appropriate electrically conductive material, including, but not limited to, metal filled epoxies and solders, such as tin, lead/tin alloys (for example, 63% tin/37% lead solder), and high tin content alloys (e.g. 90% or more tin—such as tin/bismuth, eutectic tin/silver, ternary tin/silver/copper, eutectic tin/copper, and similar alloys). The external interconnects 164 may be used to attach the integrated circuit assembly 100 to an external substrate (not shown), such as a motherboard.

When the electronic substrate 150 is an active device, it may be any appropriate device, including, but not limited to, a microprocessor, a chipset, a graphics device, a wireless device, a memory device, an application specific integrated circuit, combinations thereof, stacks thereof, or the like. The first integrated circuit device 140₁ and the second integrated circuit device 140₂ may be electrically attached to through-silicon vias (not shown) on the second surface 154 of the electronic substrate 150 (as an active device). Through-silicon vias are known in the art and for purposes of clarity and conciseness will not be discussed or illustrated herein.

As further shown in FIG. 3, a mold material layer 180 may be formed on the electronic substrate 150 and over the first integrated circuit device 140₁, the second integrated circuit device 140₂, and the universal dummy device 110. The mold material layer 180 may be any appropriate material, such as an epoxy resin. The mold material layer 180 may provide structural integrity and may prevent contamination, as will be understood to those skilled in the art.

Figure 4:
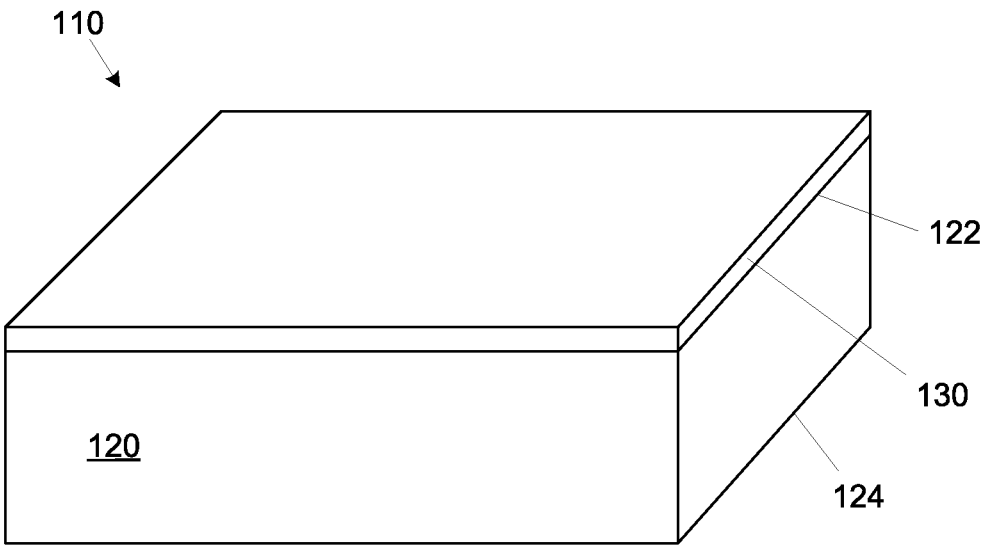
FIG. 4 is an oblique view of a universal dummy device, according to an embodiment of the present description.
Figure 5:
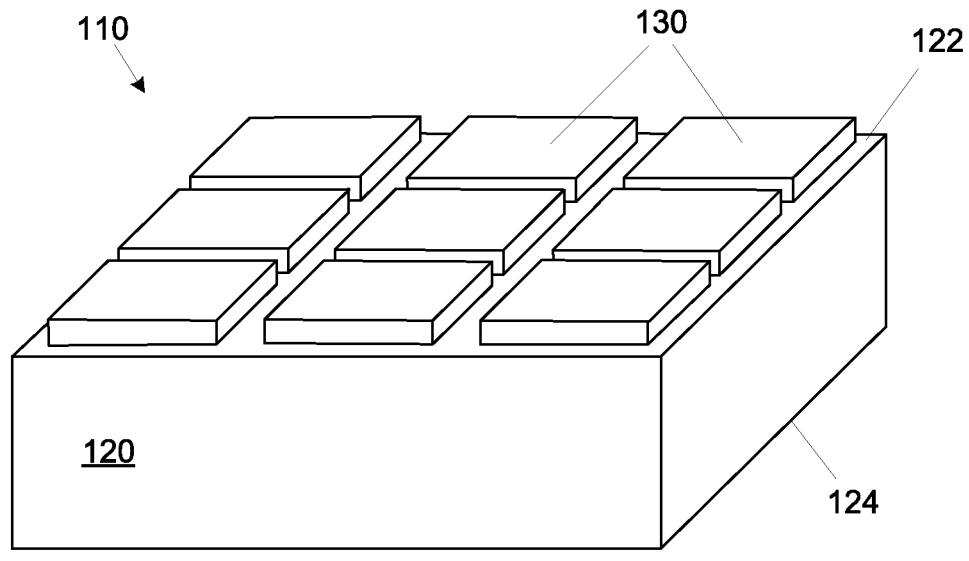
FIG. 5 is an oblique view of a universal dummy device having a patterned metallization layer, according to an embodiment of the present description.
Figure 6:
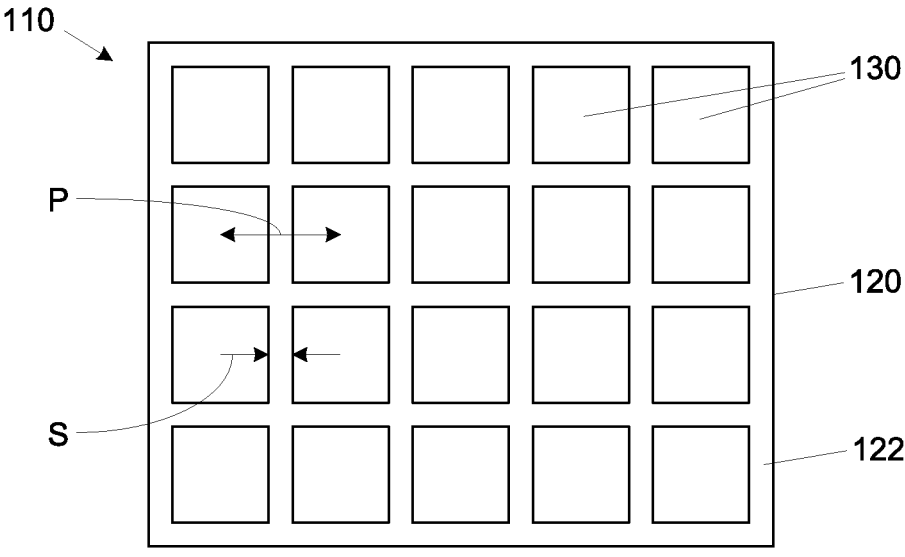
FIG. 6 is a plan view of the patterned metallization layer of a universal dummy device, according to an embodiment of the present description.

In one embodiment of the present description, as shown in FIG. 4, the metallization layer 130 may extend across the entire attachment surface of the inactive device substrate 120. In another embodiment of the present description, as shown in FIG. 5, the metallization layer 130 may be patterned on the attachment surface 122 of the inactive device substrate 120. In a specific embodiment of the present description, the patterning may be achieved by forming the metallization layer 130 across the entire attachment surface 122 of the inactive device substrate 120 (such as shown in FIG. 4), followed by ablating away, such as by laser ablation, selected portions of the metallization layer 130 to form a desired pattern. Further specific embodiments for the formation of the patterned metallization layer 130 of FIG. 5 may include patterning ink dams (not shown) on the attachment surface 122 of the inactive device substrate 120 prior to forming the metallization layer 130, patterning solder resist material (not shown) on the attachment surface 122 of the inactive device substrate 120 prior to forming the metallization layer 130, and plating the metallization layer 130 on selected areas using a photo-mask and temporary plating resist. As will be understood to those skilled in the art, the shape, the pitch P, and space S between the patterns, as shown in FIG. 6, will affect the "chip gap", e.g. the distance D (see FIG. 3) between the metallization layer 130 and the first surface 152 of the electronic substrate 150. Chip gap control through the use of patterning is well known in the art and, for the purposes of clarity and conciseness, will not be discussed herein. Furthermore, it is understood that any pattern of the bond pads 156 on the electronic substrate 150 and any pattern of the metallization layer 130 of the dummy device 110 do not have to be related to one another and each can be independently designed or optimized based on convenience. Moreover, areas within the dummy die 110 may have patterned regions of the metallization layer 130 having a relatively sparce number, a relatively dense number, or even no connections with the electronic substrate 150 based on how these independent patterns line up, as will be understood to those skilled in the art.

The embodiments of the present description may have distinct advantages over the dummy devices that are fabricated in the manner of an active integrated circuit device. The embodiments of the present description have a universal design, which means that there will be no bump layout or tape-in for masks, as will be understood to those skilled in the art. This may reduce complexity in layout and improve flexibility for change. Additionally, the embodiments of the present description may have advantages for integrated circuit packages that have mixed pitch and/or mixed critical dimensions, as it would be difficult to optimize known dummy device designs for such applications. Furthermore, no bond pads or patterning thereof are required for attachment of the universal dummy device of the present description and accurate placement will not be required. From a manufacturing standpoint, the universal dummy device will not require a high-grade material for the inactive device substrate and may be fabricated in advance, with the exception of singulation, for inventory purposes, as there will be no shelf life.

FIG. 7 is a flow chart of a process 200 of fabricating an integrated circuit package. As set forth in block 210, an inactive device substrate having an attachment surface may be formed. A metallization layer may be formed on the attachment surface of the inactive device substrate, as set forth in block 220. As set forth in block 230, an active integrated circuit device may be formed. An electronic substrate may be formed, as set forth in block 240. As set for in block 250, the metallization layer may be attached to the electronic substrate with at least one solder interconnect of a plurality of solder interconnects. The active integrated circuit device may be electrically attached to the electronic substrate with at least one other solder interconnect of the plurality of solder interconnects, as set forth in block 260.

Figure 8:
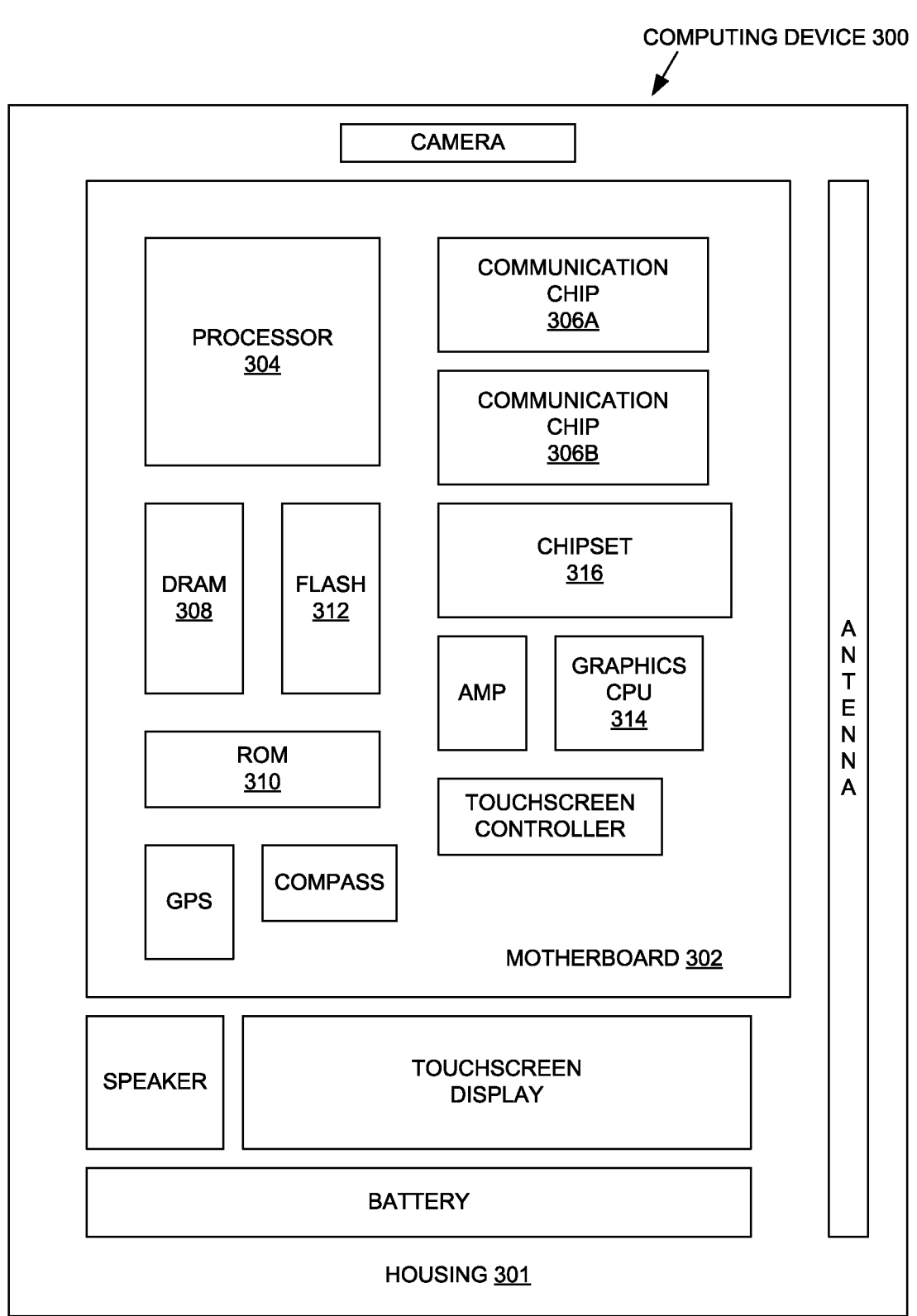
FIG. 8 is an electronic system, according to one embodiment of the present description.

FIG. 8 illustrates an electronic or computing device 300 in accordance with one implementation of the present description. The computing device 300 may include a housing 301 having a board 302 disposed therein. The computing device 300 may include a number of integrated circuit components, including but not limited to a processor 304, at least one communication chip 306A, 306B, volatile memory 308 (e.g., DRAM), non-volatile memory 310 (e.g., ROM), flash memory 312, a graphics processor or CPU 314, a digital signal processor (not shown), a crypto processor (not shown), a chipset 316, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the integrated circuit components may be physically and electrically coupled to the board 302. In some implementations, at least one of the integrated circuit components may be a part of the processor 304.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

At least one of the integrated circuit components may include an integrated circuit package comprising an electronic substrate, at least one universal dummy device comprising an inactive device substrate having an attachment surface and a metallization layer on the attachment surface, wherein the metallization layer is attached to the electronic substrate with at least one solder interconnect of a plurality of solder interconnects, and at least one active integrated circuit device, wherein the at least one active integrated circuit device to the electronic substrate with at least one other solder interconnect of the plurality of solder interconnects.

In various implementations, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-8. The subject matter may be applied to other integrated circuit devices and assembly applications, as well as any appropriate electronic application, as will be understood to those skilled in the art.

The following examples pertain to further embodiments and specifics in the examples may be used anywhere in one or more embodiments, wherein Example 1 is an integrated circuit package comprising an electronic substrate, an inactive device substrate having an attachment surface, a metallization layer on the attachment surface of the inactive device substrate, wherein the metallization layer is attached to the electronic substrate with at least one solder interconnect of a plurality of solder interconnects, and an active integrated circuit device, wherein the active integrated circuit device is electrically attached to the electronic substrate with at least one other solder interconnect of the plurality of solder interconnects.

In Example 2, the subject matter of Example 1 can optionally include the metallization layer extending across the entire attachment surface of the inactive device substrate.

In Example 3, the subject matter of Example 1 can optionally include the metallization layer being patterned on the attachment surface of the inactive device substrate.

In Example 4, the subject matter of any of Examples 1 to 3 can optionally include the metallization layer being multiple material layers.

In Example 5, the subject matter of Example 4 can optionally include the multiple layers having an outermost layer comprising low-oxidation metal.

In Example 6, the subject matter of Example 4 can optionally include the multiple material layers comprising a silicon nitride layer on the inactive device substrate, a titanium layer on the silicon nitride layer, a nickel/vanadium alloy on the titanium layer, and a gold layer on the nickel/vanadium alloy layer.

In Example 7, the subject matter of any of Examples 1 to 6 can optionally include the inactive device substrate comprising at least one of silicon and germanium.

Example 8 is an electronic system, comprising an electronic board and an integrated circuit package electrically attached to the electronic board, wherein the integrated circuit package comprises an electronic substrate, an inactive device substrate having an attachment surface, a metallization layer on the attachment surface of the inactive device substrate, wherein the metallization layer is attached to the electronic substrate with at least one solder interconnect of a plurality of solder interconnects, and an active integrated circuit device, wherein the active integrated circuit device is electrically attached to the electronic substrate with at least one other solder interconnect of the plurality of solder interconnects.

In Example 9, the subject matter of Example 8 can optionally include the metallization layer extending across the entire attachment surface of the inactive device substrate.

In Example 10, the subject matter of Example 8 can optionally include the metallization layer being patterned on the attachment surface of the inactive device substrate.

In Example 11, the subject matter of any of Examples 8 to 10 can optionally include the metallization layer being multiple material layers.

In Example 12, the subject matter of Example 11 can optionally include the multiple layers having an outermost layer comprising low-oxidation metal.

In Example 13, the subject matter of Example 11 can optionally include the multiple material layers comprising a silicon nitride layer on the inactive device substrate, a titanium layer on the silicon nitride layer, a nickel/vanadium alloy on the titanium layer, and a gold layer on the nickel/vanadium alloy layer.

Example 14 is a method of fabricating an integrated circuit package comprising forming an inactive device substrate having an attachment surface, forming a metallization layer on the attachment surface of the inactive device substrate, forming an active integrated circuit device, forming an electronic substrate, attaching the metallization layer to the electronic substrate with at least one solder interconnect of a plurality of solder interconnects, and electrically attaching the active integrated circuit device to the electronic substrate with at least one other solder interconnect of the plurality of solder interconnects.

In Example 15, the subject matter of Example 14 can optionally include forming the metallization layer to extend across the entire attachment surface of the inactive device substrate.

In Example 16, the subject matter of Example 14 can optionally include forming the at least one universal dummy device comprising patterning the metallization layer on the attachment surface of the inactive device substrate.

In Example 17, the subject matter of Example 16 can optionally include patterning the metallization layer on the attachment surface of inactive device substrate comprising forming the metallization layer to extend across the entire attachment surface of the inactive device substrate and ablating away selected portions of the metallization layer.

In Example 18, the subject matter of any of Examples 14 to 17 can optionally include forming the metallization layer comprising forming multiple material layers.

In Example 19, the subject matter of Example 18 can optionally include forming the multiple layers comprising forming an outermost layer comprising low-oxidation metal.

In Example 20, the subject matter of Example 18 can optionally include forming the multiple material layers comprising forming a silicon nitride layer on the inactive device substrate, forming a titanium layer on the silicon nitride layer, forming a nickel/vanadium alloy on the titanium layer, and forming a gold layer on the nickel/vanadium alloy layer.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. An integrated circuit device, comprising:
an electronic substrate;
an inactive device substrate having a first surface, an opposing second surface, and a plurality of edges surrounding the first surface;
a metallization layer on the first surface of the inactive device substrate, wherein the metallization layer completely covers an entirety of the first surface and extends between each of the edges, and wherein the metallization layer is attached to the electronic substrate with at least one solder interconnect of a plurality of solder interconnects, wherein the at least one solder interconnect is directly in contact with the metallization layer; and
an active integrated circuit device, wherein the active integrated circuit device is electrically attached to the electronic substrate with at least one other solder interconnect of the plurality of solder interconnects.

2. The integrated circuit device of claim 1, wherein the active integrated circuit device comprises a bond pad directly in contact with the at least one other solder interconnect.

3. The integrated circuit device of claim 2, wherein the at least one solder interconnect and the at least one other solder interconnect are in direct contact with second and third bond pads of the electronic substrate.

4. The integrated circuit device of claim 1, wherein the metallization layer comprises multiple material layers.

5. The integrated circuit device of claim 4, wherein the multiple material layers comprise an outermost layer comprising low-oxidation metal.

6. The integrated circuit device of claim 4, wherein the multiple material layers comprise a silicon nitride layer on the inactive device substrate, a titanium layer on the silicon nitride layer, a nickel/vanadium alloy layer on the titanium layer, and a gold layer on the nickel/vanadium alloy layer.

7. The integrated circuit device of claim 1, wherein the inactive device substrate comprises at least one of silicon and germanium.

8. The integrated circuit device of claim 1, further comprising:
an electronic board; and
an integrated circuit package electrically attached to the electronic board, wherein the integrated circuit package comprises the electronic substrate, the inactive device substrate, the metallization layer, the plurality of solder interconnects, and the active integrated circuit device.

9. An integrated circuit device, comprising:
an electronic substrate;
an inactive device substrate having a first surface, an opposing second surface, and a plurality of edges surrounding the first surface;
a metallization layer extending between the edges and across the first surface to completely cover the first surface of the inactive device substrate, wherein the metallization layer is attached to the electronic substrate by a plurality of first solder interconnects in direct contact with the metallization layer; and
an active integrated circuit device, wherein the active integrated circuit device is attached to the electronic substrate by a plurality of second solder interconnects.

10. The integrated circuit device of claim 9, wherein the metallization layer comprises multiple material layers.

11. The integrated circuit device of claim 10, wherein the multiple material layers comprise an outermost layer comprising low-oxidation metal.

12. The integrated circuit device of claim 10, wherein the multiple material layers comprise a silicon nitride layer on the inactive device substrate, a titanium layer on the silicon nitride layer, a nickel/vanadium alloy layer on the titanium layer, and a gold layer on the nickel/vanadium alloy layer.

13. The integrated circuit device of claim 9, wherein the inactive device substrate comprises at least one of silicon and germanium.

14. The integrated circuit device of claim 9, further comprising:

an electronic board; and an integrated circuit package electrically attached to the electronic board, wherein the integrated circuit package comprises the electronic substrate, the inactive device substrate, the metallization layer, the plurality of first solder interconnects, the active integrated circuit device, and the plurality of second solder interconnects.

15. An integrated circuit device, comprising:

an electronic substrate;

an inactive device substrate having a first surface, an opposing second surface, and a plurality of edges surrounding the first surface;

a metallization layer extending across the first surface from at least a first edge of the plurality of edges to a second edge of the plurality of edges opposite the first edge, wherein the metallization layer is attached to the electronic substrate by a plurality of first interconnects in direct contact with the metallization layer and in direct contact with first bond pads of the electronic substrate; and an active integrated circuit device, wherein the active integrated circuit device is attached to the electronic substrate by a plurality of second interconnects in direct contact with second bond pads of the electronic substrate.

16. The integrated circuit device of claim 15, wherein the metallization layer comprises multiple material layers.

17. The integrated circuit device of claim 16, wherein the multiple material layers comprise an outermost layer comprising low-oxidation metal.

18. The integrated circuit device of claim 16, wherein the multiple material layers comprise a silicon nitride layer on the inactive device substrate, a titanium layer on the silicon nitride layer, a nickel/vanadium alloy layer on the titanium layer, and a gold layer on the nickel/vanadium alloy layer.

19. The integrated circuit device of claim 15, wherein the inactive device substrate comprises at least one of silicon and germanium.

20. The integrated circuit device of claim 15, further comprising:

an electronic board; and an integrated circuit package electrically attached to the electronic board, wherein the integrated circuit package comprises the electronic substrate, the inactive device substrate, the metallization layer, the plurality of first interconnects, the active integrated circuit device, and the plurality of second interconnects.

* * * * *